United States Patent
Schnell (10) Patent No.: US 7,616,932 B2
(45) Date of Patent: Nov. 10, 2009

(54) MULTI-CHANNEL AMPLIFIER WITH REDUCED OVERALL POWER EMISSION, AND CIRCUIT MANAGEMENT INCLUDING SAME

(75) Inventor: Wilfried Schnell, Forchheim (DE)

(73) Assignee: Siemens Aktiengesellschaft, Munich (DE)

( * ) Notice: Subject to any disclaimer, the term of this patent is extended or adjusted under 35 U.S.C. 154(b) by 386 days.

(21) Appl. No.: 11/678,104

(22) Filed: Feb. 23, 2007

(65) Prior Publication Data

US 2007/0210863 A1 Sep. 13, 2007

(30) Foreign Application Priority Data

Feb. 24, 2006 (DE) ........................ 10 2006 008 725

(51) Int. Cl.
*H04B 1/04* (2006.01)
(52) U.S. Cl. .............. 455/127.3; 455/67.13; 455/236.1; 455/522
(58) Field of Classification Search .............. 455/127.3, 455/127.4, 127.5, 130, 136, 168.1, 226.1, 455/522
See application file for complete search history.

(56) References Cited

U.S. PATENT DOCUMENTS 5,872,481 A 2/1999 Sevic et al.

FOREIGN PATENT DOCUMENTS

EP 1 521 376 4/2005

*Primary Examiner*—Tony T Nguyen
(74) *Attorney, Agent, or Firm*—Schiff Hardin LLP

(57) ABSTRACT

A multi-channel amplifier has inputs via which input signals can be fed to the multi-channel amplifier. The input signals are amplified into output signals by amplifier channels of an amplification stage of the multi-channel amplifier and then are emitted via outputs of the multi-channel amplifier. An adjustment device is associated with the amplification device that allows dynamic adjustment of a limit power, up to which the respective output signal can be amplified, for each output. The limit power can be set to a maximum value for each output. The multi-channel amplifier is fashioned such that the sum of the limit powers of all outputs can always be simultaneously emitted independent of the current setting of the limit powers, but such that the sum of the limit powers is always smaller than the sum of the maximum values of all outputs. Such a multi-channel amplifier is particularly suitable for use in a transmission arrangement for radio-frequency signals.

19 Claims, 4 Drawing Sheets

MULTI-CHANNEL AMPLIFIER WITH REDUCED OVERALL POWER EMISSION, AND CIRCUIT MANAGEMENT INCLUDING SAME

BACKGROUND OF THE INVENTION

1. Field of the Invention

The present invention concerns a multi-channel amplifier as well as a transmission arrangement with such a multi-channel amplifier.

2. Description of the Prior Art

Multi-channel amplifiers are generally known. For example, in the form of multi-channel radio-frequency power amplifiers they are used as transmission amplifiers in magnetic resonance systems, and in radar and other radio-frequency transmission systems.

A multi-channel amplifier has a number of inputs via which respective input signals can be supplied to the multi-channel amplifier. Furthermore, a multi-channel amplifier has an amplification stage with a number of amplifier channels. The amplifier channels are connected with the inputs and the outputs. A maximum of one channel power can be emitted from each amplifier channel. The input signals supplied to the multi-channel amplifier can be amplified into output signals by means of the amplifier channels. A multi-channel amplifier has a number of outputs from which the output signals are emitted from the multi-channel amplifier.

For some uses of multi-channel amplifiers, it is not known in advance which output should emit which power. The multi-channel amplifier is therefore normally designed such that a limit power (load limit) can be emitted at each output, and such that the power that can be emitted in total by the multi-channel amplifier over all outputs is equal to the sum of the limit powers. Conventionally the limit power is fixed for each output by the design of the multi-channel amplifier. It is thus always set to a maximum value. This leads to large, expensive multi-channel amplifiers. Particularly for use in mains adapters and cooling devices, this means that the multi-channel amplifier must be designed such that it can handle or dissipate the sum of the limit powers.

SUMMARY OF THE INVENTION

An object of the present invention is to provide a multi-channel amplifier of the aforementioned type that is more cost-effective without having to accept power losses relative to a conventional multi-channel amplifier in practical operation.

This object is achieved in accordance with the invention by a multi-channel amplifier having the basic components described above as well as an adjustment device associated with the amplification stage, the adjustment device dynamically setting, for each output, the limit power up to which the output signal thereof can be amplified The limit power can be set at maximum to a maximum value for each output.

The multi-channel amplifier is fashioned such that the sum of the limit powers of all outputs can always be simultaneously emitted independently of the current setting of the limit powers. The sum of the limit powers, however, is always smaller than the sum of the maximum values of all outputs.

In practice this embodiment enables operation of the multi-channel amplifier at full capacity. A smaller dimensioning of multi-channel amplifiers used in mains adapters and cooling devices, however, is possible compared to the prior art. Further components of the multi-channel amplifier can possibly also be scaled down.

The full-capacity operation of the multi-channel amplifier is possible because in many cases it is unknown in advance which limit power must be emitted at which output. With high probability, the limit powers of all outputs of the inventive multi-channel amplifier do not have to simultaneously assume their maximum values.

A number of embodiments are possible for realization of the inventive multi-channel amplifier. The individual embodiments can be combined with one another or can be alternatively realized.

In a first possible embodiment, the adjustment device is an output switching matrix that is arranged between the amplifier channels and the outputs and that allows a selective setting as to which of the amplifier channels are connected with which of the outputs. The flexible association of the amplifier channels with the outputs in this case enables the adjustment of the limit power of the respective output in a simple manner.

For example, it is possible that the number of the amplifier channels that are connected with respective of the outputs can be varied by means of the output switching matrix. In this case it is advantageously possible to connect more than one amplifier channel with at least one output. The limit power of each output corresponds to the sum of the powers of the amplifier channels connected with the respective output. For example, the limit power of an output can be varied so that more or fewer amplifier channels are connected with this output.

The inputs can be connected directly with the amplifier channels. In this case the number of inputs corresponds to the number of amplifier channels, but it is also possible for the adjustment device to be an input switching matrix that is arranged between the amplifier channels and the inputs and by means of which it can be set which of the amplifier channels are connected with which of the inputs. In this case the number of inputs advantageously corresponds to the number of outputs, even when this is not absolutely necessary.

It is possible for the channel power for all amplifier channels to be the same, but it is also possible for the channel power to be channel-specific. For example, it is possible for supply voltages to be emitted from the multi-channel amplifier directly to the amplifier channels, and the channel powers that can be emitted by the amplifier channels are determined by the supply voltage supplied to the respective amplifier channel.

As an alternative to a fixed specification of a channel power for each amplifier channel, it is possible for the adjustment device to be a supply switching matrix that allows setting of which supply voltage is fed to which of the amplifier channels. The channel powers that can be emitted by the amplifier channels are determined by the supply voltage fed to the respective amplifier channel.

In the event that the channel powers that can be emitted by the amplifier channels are adjustable, it is possible for the outputs to be directly connected with the amplifier channels. The inputs can also be directly connected with the amplifier channels.

It is preferable for the multi-channel amplifier to have a mains adapter from which supply voltages that can be emitted to the amplifier channels can be generated.

In principle the numbers of amplifier channels, inputs, outputs and supply voltages can be freely selected. Normally, however, the number of the amplifier channels is at least as large as the number of outputs. In some cases it is even greater than the number of outputs. The number of inputs normally corresponds either with the number of outputs or with the number of amplifier channels.

The inventive multi-channel amplifier can be used in the framework of a transmission arrangement for radio-frequency signals. In this case the transmission arrangement has an activation device from which the transmission signals and at least one adjustment signal can be emitted. It furthermore has at least one inventively designed multi-channel amplifier. The transmission signals can be received by the at least one multi-channel amplifier as its input signals. The at least one adjustment signal can also be received by the at least one multi-channel amplifier. The adjustment device of the at least one multi-channel amplifier can be adjusted by the at least one multi-channel amplifier corresponding to the at least one adjustment signal. The transmission arrangement comprises at least one transmission antenna array by which the output signals emitted by the at least one multi-channel amplifier can be received and transmitted.

In a preferred embodiment the transmission antenna array is fashioned as a transmission antenna array for transmission of magnetic resonance excitation signals.

DESCRIPTION OF THE PREFERRED EMBODIMENTS

Figure 1:
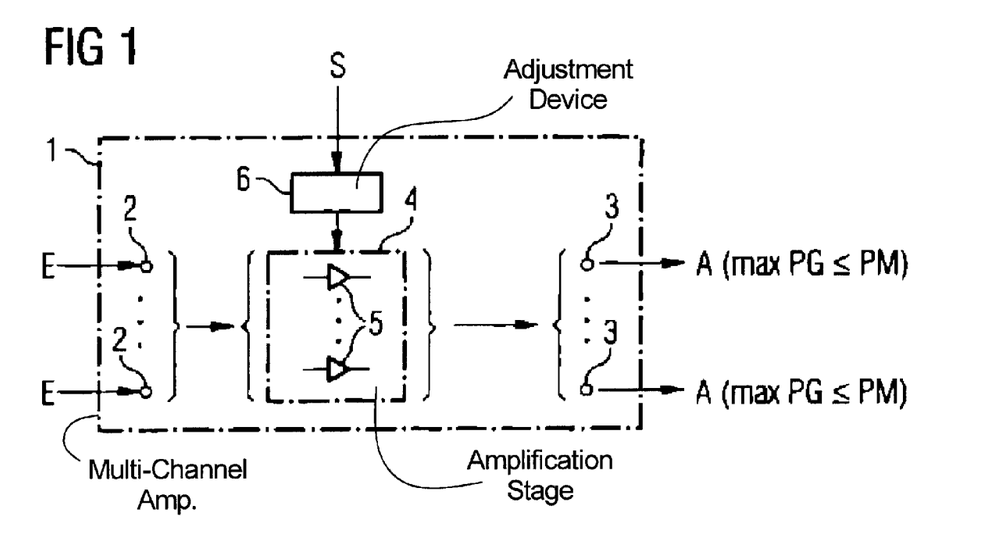
FIG. 1 shows the basic components of a multi-channel amplifier in accordance with the invention.

FIG. 1 shows the basic components of the present invention in general form. According to FIG. 1, a multi-channel amplifier 1 has a number of inputs 2 and a number of outputs 3. The number of inputs 2 and the number of outputs 3 are both greater than 1. They typically lie in a range between 8 and 256. They can be the same or different from one another. When they are different from one another, the number of inputs 2 is normally greater than the number of outputs 3, but this is not necessary.

Input signals E can be respectively fed to the multi-channel amplifier 1 at the inputs 2. The input signals E are normally alternating electrical signals, for example alternating voltage signals or alternating current signals. The input signals E are generally part radio-frequency signals. Depending on the application, their frequency is a few megahertz up to multiple gigahertzes.

An amplification stage 4 is arranged between the inputs 2 and the outputs 3. The amplification device 4 has a number of amplifier channels 5. The amplifier channels 5 are connected with the inputs 2 and the outputs 3. The input signals E supplied to the multi-channel amplifier 1 can be amplified into output signals A by the amplifier channels 5. The output signals A are emitted at the outputs 3. The output signals A are normally likewise alternating electrical signals.

The frequency of the output signals A corresponds to the frequency of the respective input signals E. The phase positions of the output signals A are normally unaltered among one another relative to the phase positions of the corresponding input signals E.

To the extent described thus far, the multi-channel amplifier 1 essentially corresponds to a conventional multi-channel amplifier. In contrast to conventional multi-channel amplifiers, however, the multi-channel amplifier 1 of FIG. 1 has an adjustment device 6. The adjustment device 6 is associated with the amplification stage 4. A limit power PG up to which the respective output signal A can be amplified can be dynamically adjusted for each output 3 by means of the adjustment device 6. When one of the input signals E rises from zero, the corresponding output signal A thus also initially rises linearly until the output signal A exhibits the limit power PG. When the corresponding input signal E subsequently rises even further, this value of the output signal A is retained. The output signal A is thus bounded at or limited to the limit power PG.

The limit powers PG of the outputs 3 naturally are not entirely freely adjustable. The limit powers PG of the outputs 3 can be adjusted to a maximum value PM. The limit powers PG, however, are variable below these maximum values PM. For each output 3, the limit power PG thereof is thus not statically predetermined. Rather, the adjustment ensues dynamically dependent on an adjustment signal S that is supplied from the outside to the multi-channel amplifier 1. The maximum values PM of the outputs 3 can be equal among one another or they can also be different from one another.

The limit powers PG normally lie in the range from multiple watts up to several kilowatts. The multi-channel amplifier 1 is therefore fashioned as a power amplifier.

The multi-channel amplifier 1 is fashioned such that the sum of the limit powers PG of all outputs 3 can be emitted simultaneously by the multi-channel amplifier 1, independent of the current setting of the limit powers PG. At the same time, however, the simulation of the limit powers PG of all outputs 3 is always smaller than the simulation of the maximum values PM of all outputs 3, again independent of the current setting of the limit powers PG.

The adjustable limit powers PG can be the same for all outputs 3 or they can be different from one another. The maximum values PM of the outputs 3 can likewise be the same among one another or different from one another.

Various possible embodiments of the multi-channel amplifier 1 of FIG. 1 are subsequently described in connection with FIGS. 2 through 6. Where appropriate, the same reference characters as used as in FIG. 1 are used in FIGS. 2-6.

Figure 2:
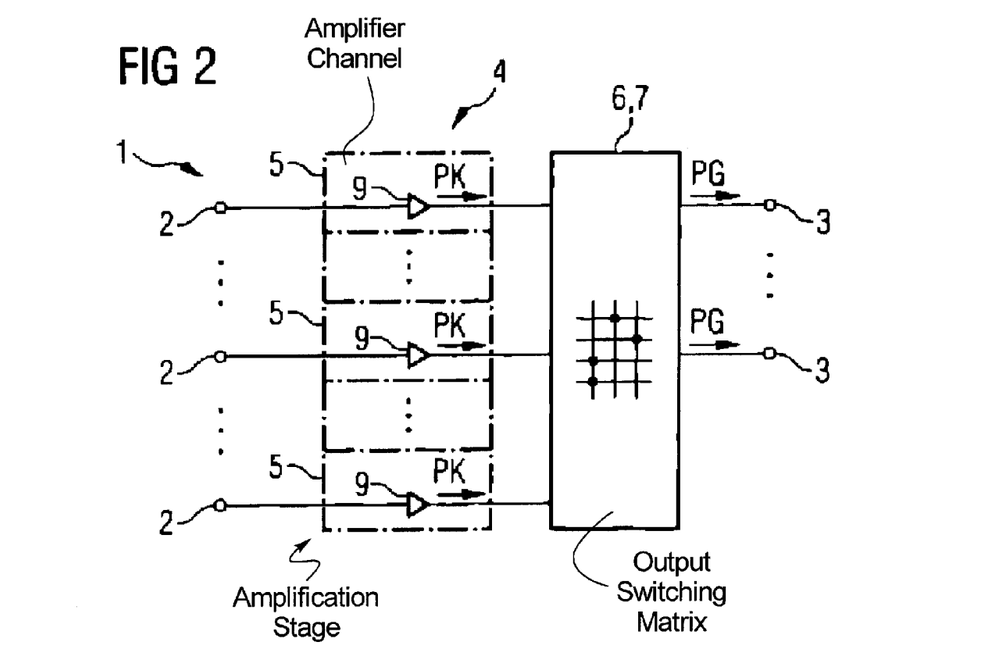
FIGS. 2 through 6 respectively show various possible embodiments of the multi-channel amplifier of FIG. 1.
Figure 3:
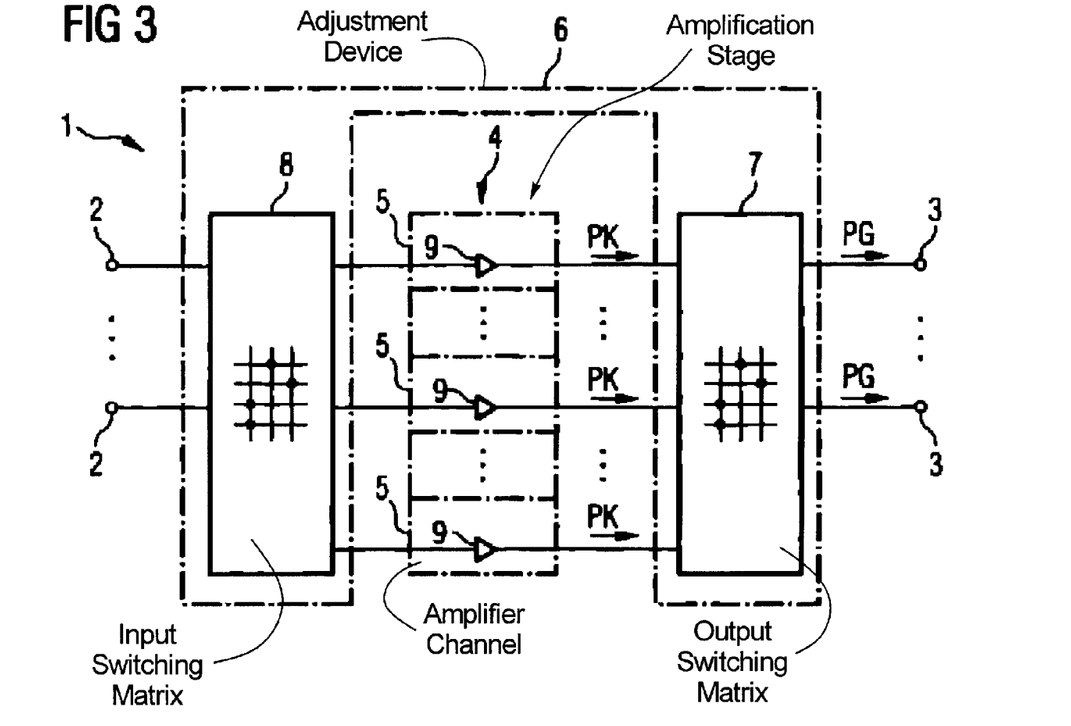

According to FIGS. 2 and 3, an output switching matrix 7 is arranged between the amplifier channels 5 and the outputs 3. The output switching matrix 7 is a component of the adjustment device 6. Which of the amplifier channels 5 are connected with which of the outputs 3 can be adjusted by means of the output switching matrix 7. The adjustment of the output switching matrix 7 ensues dependent on the adjustment signal S.

In the embodiments according to FIGS. 2 and 3, the number of amplifier channels 5 is greater than the number of outputs 3. It is therefore possible that, by means of the output switching matrix 7, more amplifier channels 5 are connected with the outputs 3 than the number of outputs 3. In this case there exists at least one output 3 that is simultaneously connected with at least two amplifier channels 5. Which of the outputs 3 this is varies from setting to setting of the output switching matrix 7.

Each amplifier channel 5 can at maximum emit a channel power PK. For each output 3 this limit power PG therefore corresponds to the sum of the channel powers PK of the amplifier channels 5 that are connected with this output 3 in the respective setting of the output switching matrix 7. In the embodiments of FIGS. 2 and 3 the limit power PG of an output 3 therefore can be adjusted among other things, by selecting how many amplifier channels 5 are connected with a respective output 3.

All amplifier channels 5 can normally be simultaneously connected with the outputs 3. When, for example, 16 outputs 3 and 20 amplifier channels 5 are present, all amplifier channels 5 can thus advantageously be simultaneously connected with the 16 outputs 3. It is also possible that (in order to remain in the example with 16 outputs 3 and 20 amplifier channels 5) only 17 or 18 amplifier channels 5 can be simultaneously connected without the outputs 3. Which of the amplifier channels 5 are connected with the outputs 3 is in this case determined by the adjustment signal S. This procedure can be meaningful when the channel powers PK of the amplifier channels 5 are not all the same among one another.

In the embodiment according to FIG. 2, the inputs 2 are directly connected with the amplifier channels 5. In the embodiment of FIG. 2 the number of inputs 2 is thus equal to the number of amplifier channels 5 but can be greater than the number of outputs 3. In this embodiment it must be ensured that the same input signal E is supplied to those of the amplifier channels 5 that are connected with the same output 3.

By contrast, in the embodiment according to FIG. 3 an input switching matrix 8 is arranged between the inputs 2 and the amplifier channels 5. The input switching matrix 8 is likewise a component of the adjustment device 6. Which of the amplifier channels 5 are connected with which of the inputs 2 can be adjusted by means of the input switching matrix 8.

The input switching matrix 8 can also be adjusted by means of the adjustment signal S. The adjustment of the input switching matrix 8 can be required to correspond with the adjustment of the of the output switching matrix 7, or it can be independent of the adjustment of the output switching matrix 7.

Due to the presence of the input switching matrix 8, the number of inputs 2 does not necessarily have to coincide with the number of amplifier channels 5. In the embodiment according to FIG. 3 the number of inputs 2 is advantageously selected such that it is equal to the number of outputs 3. In principle, however, the number of inputs 2 is arbitrary.

In the embodiments according to FIGS. 2 and 3, for each output 3 its limit power PG can already be varied by varying the number of the amplifier channels 5 connected with the respective output 3 is varied. It is therefore possible that the channel powers PK that can be emitted by the amplifier channels 5 are the same among one another and cannot be adjusted. This is indicated in FIGS. 2 and 3 by each amplifier channel 5 containing an amplifier element 9, the amplifier elements 9 being shown of equal size. In this case, for example, the maximum value PM of an output 3 is determined by the number of the amplifier channels 5 that can be simultaneously connected with the output 3. In addition to varying the number of the amplifier channels 5 connected with a respective output 3, it is also possible to provide amplifier channels 5 that exhibit channel powers PK differing from one another (see subsequent explanations regarding FIGS. 4 and 5). It is also possible to (possibly additionally) adjust the channel power PK of the respective amplifier channel 5 (see subsequent explanations regarding FIG. 6).

Figure 4:
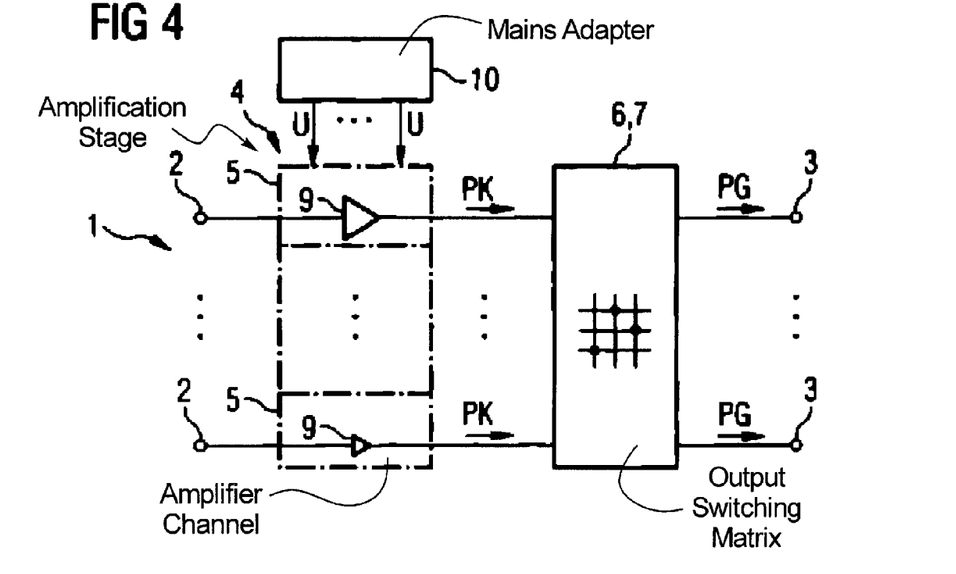
Figure 5:
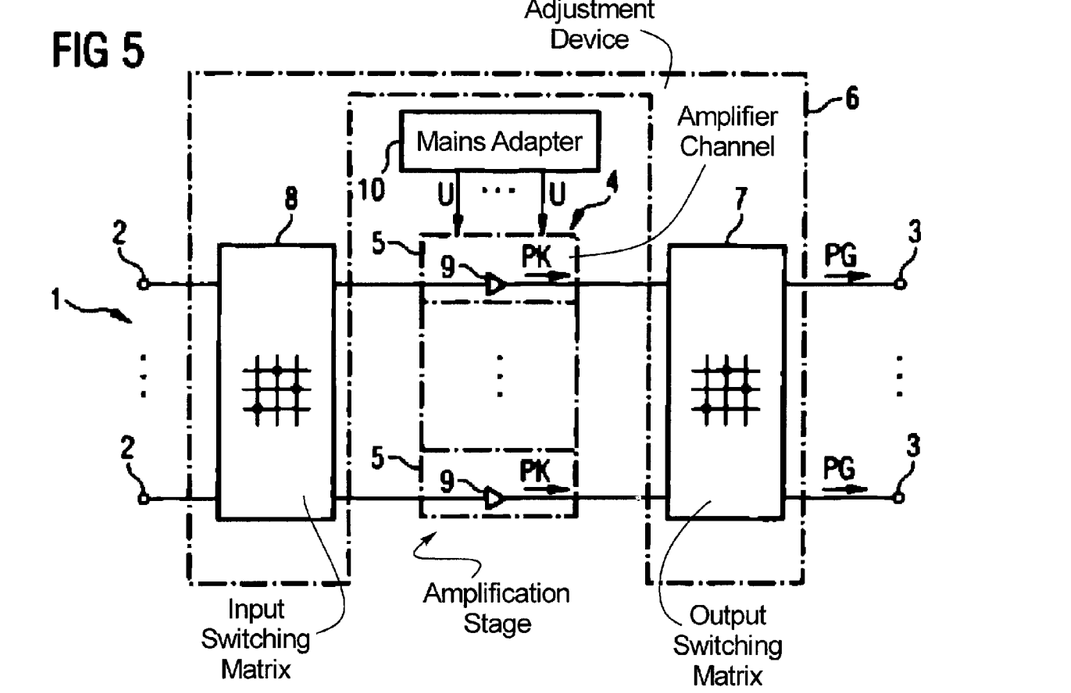

In the embodiments according to FIGS. 4 and 5 an output switching matrix 7 is likewise associated with the amplification device 4. The output switching matrix 7 corresponds in terms of its function to the output switching matrix 7 of FIGS. 2 and 3. The embodiment subsequently described in connection with FIGS. 4 and 5 can be combined with the embodiments of FIGS. 2 and 3. The embodiment subsequently described in connection with FIGS. 4 and 5 can be combined with the embodiments of FIGS. 2 and 3. This is particularly advantageous in the event that the number of amplifier elements 5 is greater than the number of outputs 3.

In principle, in the embodiments of FIGS. 4 and 5 the number of the amplification channels 5 is independent of the number of the outputs 3. The number of amplification channels 5 thus can be greater or smaller than the number of outputs 3. The number of amplification channels 5 is advantageously equal to the number of outputs 3.

In the embodiments according to FIGS. 4 and 5, the maximum channel powers PK that can be emitted by the amplifier channels 5 are channel-specific. This is indicated in FIGS. 4 and 5 by amplifier channels 5 respectively containing an amplifier element 9 and the amplifier elements 9 are shown to be of different sizes.

In order to be able to design the channel powers PK specific to the channel, the amplifier channels 5 can be designed, for example, such that the maximum channel powers PK that can be emitted by them are different from one another. It is also possible for the multi-channel amplifier 1 to have supply connections via which supply voltages U can be fed individually or in groups to the amplifier channels 5, and that the maximum channel powers PK that can be emitted by the amplifier channels 5 are determined by the supply voltage U fed to the respective amplifier channel 5. As shown in FIGS. 4 and 5, however, the multi-channel amplifier 1 advantageously has a mains adapter 10. The supply voltages U that can be emitted to the amplifier channels 5 can be generated by the mains adapter 10.

When (analogous to FIGS. 2 and 3) the number of the amplifier channels 3 connected with one of the outputs 3 can be varied in FIGS. 4 and 5, the limit power PG of this output 3 can also be varied by the connection of more or fewer of the amplifier channels 5 with the respective output 3. In the embodiments of FIGS. 4 and 5, for each of the outputs 3 the limit power PG can already be varied by one specific amplifier channel 5 being connected with this output 3. Since the channel powers PK are channel-specific, the limit power PG that can be emitted by the respective output 3 is also variable by varying which of the amplifier channels 5 is connected with the respective output 3. The channel-specific channel power PK of this amplifier channel 4 corresponds to the respective limit power PG. The maximum value PM of each output 3 is in this case equal to the largest of the channel powers PK of the amplifier channels 5 that can actually be connected with this output 3.

Analogous to the embodiment of FIG. 2, in the embodiment of FIG. 4 the inputs 2 are directly connected with the amplifier channels 5. The embodiments from FIG. 2 in this regard are therefore analogously applicable. In particular in the event that more than one of the input signals E can be connected through to the same output 3, it must be ensured that the same input signal E is supplied to the corresponding inputs 2.

In contrast to this, in the embodiment according to FIG. 5 an input switching matrix 8 is arranged between the inputs 2 and the amplifier channels 5 (analogous to FIG. 3). The input switching matrix 8 from FIG. 5 corresponds in terms of its function to the input switching matrix 8 from FIG. 3. As in the embodiment according to FIG. 3, which of the amplifier channels 5 are connected with which of the inputs 2 can likewise be adjusted by means of the input switching matrix 8.

In the embodiments of FIGS. 4 and 5 the limit powers PG of the outputs 3 can thus be varied in that specific amplifier channels 5 are connected with specific outputs 3 since the channel powers PK can be emitted by the amplifier channels 5 in a channel-specific manner. It is therefore not required that the number of the amplifier channels 5 connected with a specific output 3 be varied by means of the output switching matrix 7, but such a combination is also possible. It is also not required to vary the channel power PK that can be emitted by a specific amplifier channel 5 as such, but this is also possible (see subsequent embodiments with regard to FIG. 6).

Figure 6:
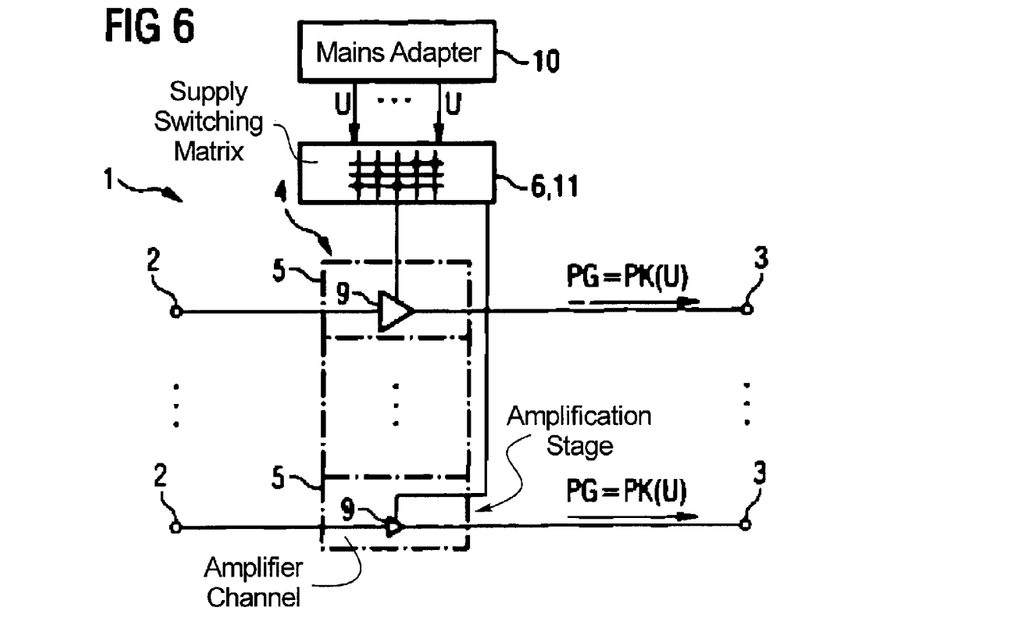

In the embodiment according to FIG. 6, the adjustment device 6 has a supply switching matrix 11. Which of a number of supply voltages U is supplied to which of the amplifier channels 5 can be adjusted by means of the supply switching matrix 11. The adjustment of the supply switching matrix 11 ensues dependent on the adjustment signal S. The channel powers PK that can be emitted by the amplifier channels 5 are determined by the supply voltage U supplied to the respective amplifier channel 5 (if applicable in connection with further parameters determined by the design of the multi-channel amplifier 1).

In the embodiment according to FIG. 6 the number of outputs 3 is equal to the number of amplifier channels 5. In this case it is possible for the outputs 3 to be connected directly with the amplifier channels 5. However, it would also be possible to arrange an output switching matrix 7 between the amplifier channels 5 and the outputs 3. In this case the number of outputs 3 is independent of the number of amplifier channels 5. In particular in this case the number of amplifier channels 5 can be greater than the number of outputs 3.

In the embodiment according to FIG. 6, the number of inputs 2 furthermore corresponds to the number of amplifier channels 5. In this case, as shown in FIG. 6, the inputs 2 can be directly connected with the amplifier channels 5. However, analogous to FIGS. 3 and 5 an input switching matrix 8 can also be present that allows setting of which the amplifier channels 5 are connected with which of the inputs 2. In this case the number of the inputs 2 is independent of the number of amplifier channels 5. In this case the number of inputs 2 is advantageously smaller than the number of amplifier channels 5. When an output switching matrix 8 is also present, it can be equal to the number of outputs 3.

In principle it is possible to feed the supply voltages U to the multi-channel amplifier 1 via external connections. However, the multi-channel amplifier 1 as shown in FIG. 6 advantageously comprises a mains adapter 10 by which the supply voltages U can be generated.

In the embodiment according to FIG. 6, the limit power PG that can be emitted by a specific output 3 depends on which supply voltage U is fed to the respective amplifier channel 5. The maximum value PM of the respective output 3 is determined by the largest of the supply voltages U that can be fed to the respective amplifier channel 5. By the embodiment of the supply switching matrix 11 it is ensured that, independent of the setting of the supply switching matrix 11, the largest supply voltage U for the respective amplifier channel 5 is not simultaneously fed to all amplifier channels 5.

In the embodiment according to FIG. 6 it is not necessary that an output switching matrix 7 be present, by means of which output switching matrix 7 which (and possibly how many) of the amplifier channels 7 are connected with the outputs 3 can be varied. However, it is possible to provide such an output switching matrix 7 (see above embodiments with regard to FIGS. 2 and 3). The amplifier channels 5 can also be fashioned the same among one another such that they exhibit the same channel power PK when the same supply voltage U is fed to them. However, it is also possible to design the individual amplifier channels 5 in various ways such that they exhibit channel powers PK differing from one another in spite of being fed the same supply voltage U (see above embodiments with regard to FIGS. 4 and 5).

In the inventive multi-channel amplifier 1 the amplification device 4 thus can be surrounded (corresponding to FIG. 7) by two or by three switching matrices 7, 8, 11, namely the output switching matrix 7, the input switching matrix 8 and the supply switching matrix 11. It advantageously applies for each of the switching matrices 7, 8, 11 that each amplifier channel 5 is connected with a maximum of one corresponding element 2, 3, U, thus with a maximum of one output 3, a maximum of one input 2 or, respectively, a maximum of one supply voltage U. This is explained in detail in the following for the output switching matrix 7. Analogous statements apply for the input switching matrix 8 and the supply switching matrix 11.

Figure 7:
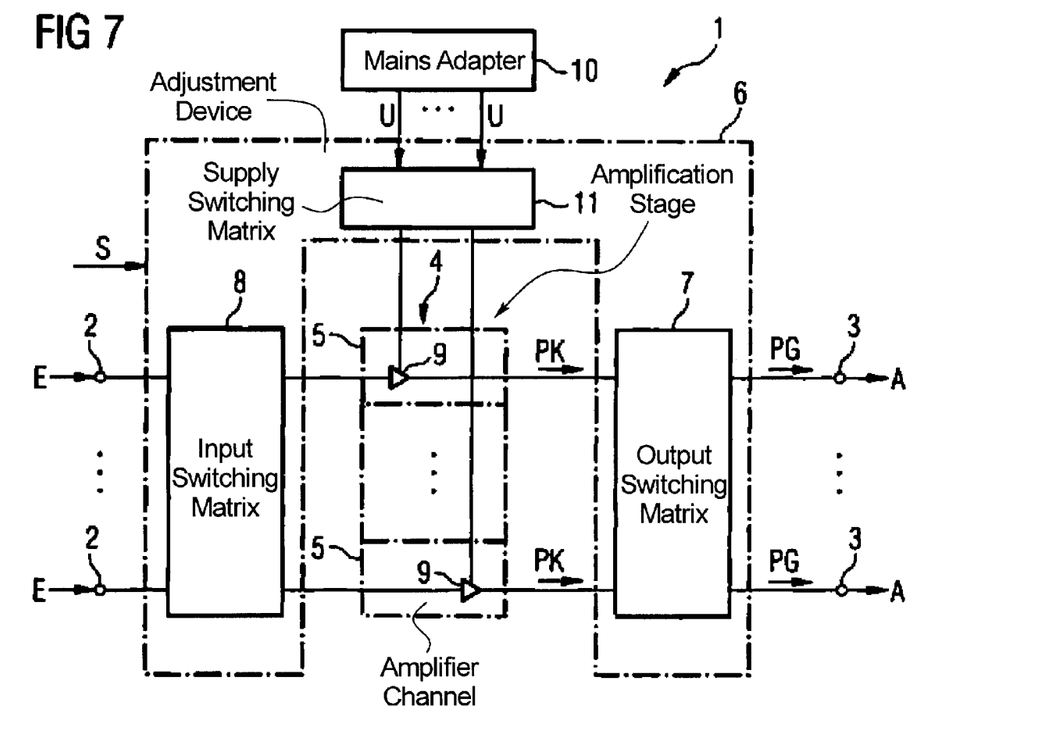
FIG. 7 is an alternative representation of the multi-channel amplifier of FIG. 1.

When the number of outputs 3 is greater than the number of amplifier channels 5, each amplifier channel 5 is advantageously connected either with none or with only one of the outputs 3 in each possible setting of the output switching matrix 7. By contrast, none of the amplifier channels 5 is simultaneously connected with two or more outputs 3. In reverse, each output 3 is also advantageously connected either with none or with precisely one of the amplifier channels 5. Contrarily, none of the outputs 3 is simultaneously connected with two or more amplifier channels 5.

Analogous statements apply when the number of outputs 3 is equal to the number of amplifier channels 5. Due to the parity of the numbers, the association of the amplifier channels 5 with the outputs 3 thus advantageously corresponds to a permutation.

When the number of outputs 3 is smaller than the number of amplifier channels 5, each amplifier channel 5 is advantageously still connected either with none or with precisely one of the outputs 3. Furthermore, none of the amplifier channels S is thus simultaneously connected with two or more outputs 3. By contrast, at least one of the outputs 3 can be connected with multiple amplifier channels 5. Which output 3 this is dependent on the setting of the output switching matrix 7. The maximum number of amplifier channels 5 that can be connected with this output 3 is advantageously one more than the difference between the number of amplifier channels 5 and the number of outputs 3.

The inventive multi-channel amplifier 1 can be used for a transmission arrangement for radio-frequency signals a. Such a transmission arrangement according to FIG. 8 comprises a control device 12, for example a software-controlled processor 13 with downstream DA converters 14. Transmission signals e can be emitted by the control device 12 (for example via the DA converters 14). The transmission arrangement furthermore comprises at least one inventively designed multi-channel amplifier 1. The multi-channel amplifier 1 receives (acquires) the transmission signals e as its input signals E.

Figure 8:
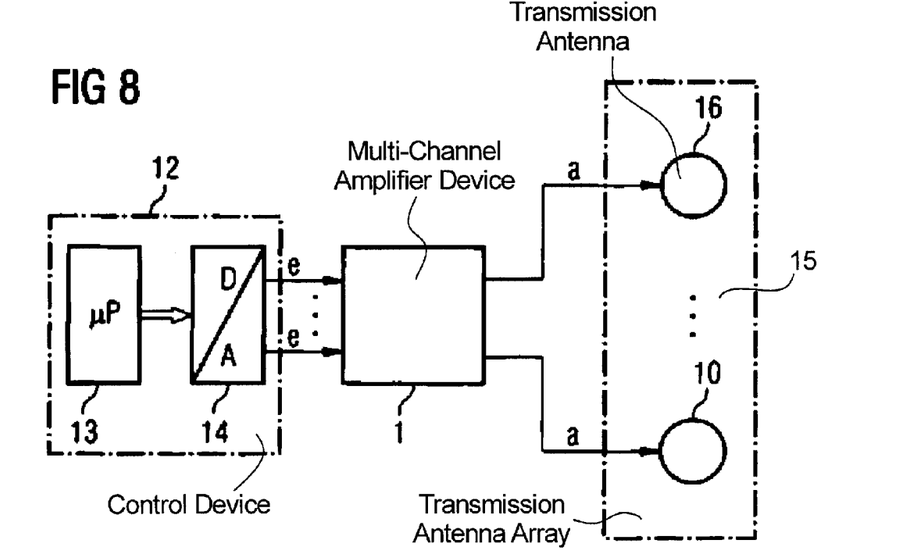
FIG. 8 is a block diagram of a transmission arrangement embodying a multi-channel amplifier in accordance with the invention.

Furthermore, at least one adjustment signal S can be emitted by the control device 12. The inventive multi-channel amplifier 1 also receives the at least one adjustment signal S. The multi-channel amplifier 1 adjusts its adjustment device 6 corresponding to the at least one adjustment signal S. Insofar as one is present, it thus adjusts its output switching matrix 7, its input switching matrix 8 and/or its supply switching matrix 11 corresponding to the at least one adjustment signal S.

the transmission arrangement includes at least one transmission antenna array 15. The transmission antenna array 15 can be fashioned, for example, as a transmission antenna array 15 for emission of magnetic resonance excitation signals a. The at least one transmission antenna array 15 receives the output signals A emitted by the at least one multi-channel amplifier 1 and transmits them, for example in the form of the magnetic resonance excitation signals as just mentioned.

In particular given the application just mentioned for generation of magnetic resonance excitation signals a, the individual transmission antennas 16 of the transmission antenna array 15 must be capable of being activated with amplitudes differing from one another. The amplitudes in particular depend on the type and position of an examination subject relative to the transmission antennas 16 and possibly also on a specific relevant region of the examination subject. The individual transmission antennas 16 therefore must always be able to emit a minimum power that normally defines a uniform maximum value PM. Moreover, it is extremely improbable that all transmission antennas 15 must simultaneously emit this power PM. Due to the inventively designed multi-channel amplifier 1, an (in practice) unlimited operation of the transmission antenna array 15 is thus possible. Nevertheless, In particular a cooling device of the multi-channel amplifier 1 (which cooling device is not shown in FIG. 8 for clarity) can be dimensioned smaller than this is possible in the prior art. Depending on the selected realization, a more cost-effective design of the remaining elements of the multi-channel amplifier 1 thus can be possible, in particular insofar as it concerns the design of the mains adapter 10 and the embodiment of the amplifier channels 5.

Although modifications and changes may be suggested by those skilled in the art, it is the intention of the inventor to embody within the patent warranted hereon all changes and modifications as reasonably and properly come within the scope of his contribution to the art.

I claim as my invention:

1. A multi-channel amplifier comprising:
    a plurality of inputs each configured to receive an input signal;
    a plurality of outputs;
    an amplifier stage comprising a plurality of amplifier channels connectable with respective inputs and respective outputs, each amplifier channel having a maximum channel power that can be emitted by that amplifier channel, each amplifier channel being connectable to at least one of said inputs and at least one of said outputs and amplifying the respective input signal for said at least one of said inputs to produce an amplified output signal at said at least one of said outputs; and
    an adjustment device associated with said amplification stage, said adjustment device, for each of said amplifier channels, dynamically setting a limit power for amplification of the output signal emitted by that amplifier channel, said limit power being set a maximum value for each of said outputs, and said adjustment device being operable to cause a sum of the respective limit powers for all of said outputs to be simultaneously emitted independent of respective settings of said limit powers, with said sum of said limit powers always being smaller than a sum of said maximum values of all of said outputs.

2. A multi-channel amplifier as claimed in claim 1 wherein said adjustment device comprises an output switching matrix connected between said amplifier channels and said outputs, allowing selective connection of respective amplifier channels to respective outputs.

3. A multi-channel amplifier as claimed in claim 2 wherein said output switching matrix varies a number of amplifier channels that are connected to respective ones of said outputs.

4. A multi-channel amplifier as claimed in claim 2 wherein said inputs are directly connected to said amplifier channels.

5. A multi-channel amplifier as claimed in claim 2 wherein said adjustment device also comprises an input switching matrix connected between said amplifier channels and said inputs, said input switching matrix allowing selective connection of respective amplifier channels to respective inputs.

6. A multi-channel amplifier as claimed in claim 2 wherein said channel power is channel-specific with regard to the respective amplifier channels.

7. A multi-channel amplifier as claimed in claim 6 wherein each of said amplifier channels operates with a respective supply voltage, and wherein said adjustment device sets the respective channel powers dependent on the respective supply voltages of the respective amplifier channels.

8. A multi-channel amplifier as claimed in claim 7 comprising a means adapter at which said supply voltages are generated.

9. A multi-channel amplifier as claimed in claim 2 wherein each of said amplifier channels operates with a respective supply voltage, and wherein said adjustment device also comprises a supply switching matrix that selectively sets the respective supply voltages supplied to the respective amplifier channels and sets the respective channel powers of the respective amplifier channels dependent on the respective supply voltages supplied thereto.

10. A multi-channel amplifier as claimed in claim 9 comprising a means adapter at which said supply voltages are generated.

11. A multi-channel amplifier as claimed in claim 1 wherein each of said amplifier channels operates with a respective supply voltage, and wherein said adjustment device comprises a supply switching matrix that selectively sets the respective supply voltages supplied to the respective amplifier channels and sets the respective channel powers of the respective amplifier channels dependent on the respective supply voltages supplied thereto.

12. A multi-channel amplifier as claimed in claim 9 wherein the outputs are respectively directly connected to said amplifier channels.

13. A multi-channel amplifier as claimed in claim 9 wherein said inputs are respectively directly connected to said amplifier channels.

14. A multi-channel amplifier as claimed in claim 11 comprising a means adapter at which said supply voltages are generated.

15. A multi-channel amplifier as claimed in claim 1 wherein said plurality of amplifier channels is at least as large as said plurality of outputs.

16. A multi-channel amplifier as claimed in claim 1 wherein said plurality of inputs equals said plurality of outputs.

17. A multi-channel amplifier as claimed in claim 1 wherein said plurality of inputs and said plurality of amplifier channels and said plurality of outputs are all equal.

18. A transmission arrangement for radio-frequency signals comprising:
    a source of radio-frequency signals;
    a multi-channel amplifier comprising a plurality of inputs respectively connected to said source to respectively receive said RF signals therefrom, a plurality of outputs, and an amplifier stage comprising a plurality of amplifier channels connectable with respective inputs and respective outputs, each amplifier channel having a maximum channel power that can be emitted by that amplifier channel, each amplifier channel being connectable to at least one of said inputs and at least one of said outputs and amplifying the respective input signal for said at least one of said inputs to produce an amplified output signal at said at least one of said outputs, and an adjustment device associated with said amplification stage, said adjustment device, for each of said amplifier channels, dynamically setting a limit power for amplification of the output signal emitted by that amplifier channel, said limit power being set a maximum value for each of said outputs, and said adjustment device being operable to cause a sum of the respective limit powers for all of said outputs to be simultaneously emitted independent of respective settings of said limit powers, with said sum of said limit powers always being smaller than a sum of said maximum values of all of said outputs; and a transmission antenna array connected to said outputs of said multi-channel amplifier and receiving said output signals therefrom.

19. A transmission arrangement as claimed in claim 18 wherein said transmission antenna array comprises a transmission antenna array configured to emit magnetic resonance excitation signals.

* * * * *